US012663339B2

(12) United States Patent
Shriyan et al.

(10) Patent No.: US 12,663,339 B2
(45) Date of Patent: Jun. 23, 2026

(54) SYSTEM AND METHOD OF FIBER LOCATION MAPPING IN A MULTI-BEAM SYSTEM

(71) Applicant: KLA Corporation, Milpitas, CA (US)

(72) Inventors: Sameet K. Shriyan, Milpitas, CA (US); Frank Essmeier, Milpitas, CA (US); Hedong Yang, Santa Clara, CA (US)

(73) Assignee: KLA Corporation, Milpitas, CA (US)

( * ) Notice: Subject to any disclaimer, the term of this patent is extended or adjusted under 35 U.S.C. 154(b) by 798 days.

(21) Appl. No.: 17/848,860

(22) Filed: Jun. 24, 2022

(65) Prior Publication Data

US 2023/0003615 A1     Jan. 5, 2023

Related U.S. Application Data

(60) Provisional application No. 63/218,083, filed on Jul. 2, 2021.

(51) Int. Cl.
*G01M 11/00* (2006.01)
*G06T 7/00* (2017.01)
(Continued)

(52) U.S. Cl.
CPC ........... *G01M 11/33* (2013.01); *G06T 7/0004* (2013.01); *G06T 7/30* (2017.01); *G06T 7/66* (2017.01);
(Continued)

(58) Field of Classification Search
None
See application file for complete search history.

(56) References Cited

U.S. PATENT DOCUMENTS 5,559,909 A      9/1996 Anderson et al.
6,587,189 B1 *   7/2003 Roberts .................. H04N 23/55
                                                            356/73.1

(Continued)

FOREIGN PATENT DOCUMENTS

GB          1595206 A  *  8/1981  ........... A61B 5/1459
KR       100406864 B1    11/2003
WO      2020065094        4/2020

OTHER PUBLICATIONS

Chattopadhyay, Sabyasachi, et al. "Fiber positioning in microlens-fiber coupled integral field unit." Journal of Astronomical Telescopes, Instruments, and Systems 6.2 (2020): 025002-025002. (Year: 2020).*

(Continued)

*Primary Examiner* — Matthew C Bella
*Assistant Examiner* — Johnny B Duong
(74) *Attorney, Agent, or Firm* — Hodgson Russ LLP

(57)     ABSTRACT

A multi-beam system includes a light source configured to emit light; a fiber bundle connected to the light source; and a camera configured to capture an image set including images corresponding to each fiber connected to the light source. The fiber bundle includes a central fiber having one end connected to the light source, and N layers of fibers surrounding the central fiber. The first layer of fibers includes M fibers, each having one end connected to the light source, and the Nth layer of fibers includes more than M fibers, but only M fibers in the Nth layer of fibers have one end connected the light source. A processor is configured to determine a centroid of each image in the image set to produce a centroid map and generate a fiber location map comprising fiber locations of all fibers in the fiber bundle based on the centroid map.

20 Claims, 5 Drawing Sheets

(51) Int. Cl.

| | | |
|---|---|---|
| *G06T 7/30* | (2017.01) | |
| *G06T 7/66* | (2017.01) | |
| *G06T 7/70* | (2017.01) | |
| *H10P 72/00* | (2026.01) | |

(52) U.S. Cl.
CPC ...... *G06T 7/70* (2017.01); *G06T 2207/30148* (2013.01); *H10P 72/0604* (2026.01)

(56) References Cited

U.S. PATENT DOCUMENTS

| | | | |
|---|---|---|---|
| 7,130,039 | B2 | 10/2006 | Vaez-Iravani et al. |
| 7,489,393 | B2 | 2/2009 | Biellak et al. |
| 7,504,622 | B2 | 3/2009 | Elyasaf et al. |
| 9,336,982 | B2 | 5/2016 | Zeidler et al. |
| 9,536,702 | B2 | 1/2017 | Lang et al. |
| 10,338,013 | B1 | 7/2019 | Brodie et al. |
| 2004/0037554 | A1 | 2/2004 | Ferguson et al. |
| 2013/0058661 | A1 | 3/2013 | Greiss et al. |
| 2015/0090879 | A1 | 4/2015 | Zeidler et al. |
| 2015/0168702 | A1* | 6/2015 | Harris .................. G02B 21/367 |
| | | | 250/306 |
| 2015/0357157 | A1 | 12/2015 | Mueller et al. |
| 2016/0247271 | A1* | 8/2016 | Hishida ................. G06T 7/0004 |
| 2017/0331990 | A1* | 11/2017 | Heshmat Dehkordi ..................... |
| | | | H04N 23/56 |
| 2019/0371566 | A1 | 12/2019 | Sears et al. |

OTHER PUBLICATIONS

Leung, Christopher Kai-shun, et al. "Retinal nerve fiber layer imaging with spectral-domain optical coherence tomography: a variability and diagnostic performance study." Ophthalmology 116.7 (2009): 1257-1263. (Year: 2009).*

SchÃ¶ttl, Ludwig, et al. "A novel approach for segmenting and mapping of local fiber orientation of continuous fiber-reinforced composite laminates based on volumetric images." NDT & E International 110 (2020): 102194. (Year: 2020).*

WIPO, International Search Report for International Application No. PCT/US2022/035617, Oct. 19, 2022.

WIPO, Written Opinion of the International Searching Authority for International Application No. PCT/US2022/035617, Oct. 19, 2022.

* cited by examiner

100

106

107 receiving an image from the tool having error

108 overlaying the fiber location map and the image from tool and identifying centers

109 aligning centers and finding shift, ROAM, and/or astigmatism

110 performing linear distortion correction

200

230

SYSTEM AND METHOD OF FIBER LOCATION MAPPING IN A MULTI-BEAM SYSTEM

CROSS-REFERENCE TO RELATED APPLICATIONS

This application claims priority to the provisional patent application filed Jul. 2, 2021 and assigned U.S. App. No. 63/218,083, the entire disclosure of which is hereby incorporated by reference.

FIELD OF THE DISCLOSURE

This disclosure relates to inspection systems and, more particularly, to multi-beam inspection systems.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

One device used for inspection processes is a multi-beam system. In a multi-beam system, hundreds of beamlets are focused onto a scintillator. Light from the scintillator may be focused using optical fibers. The focused beamlets should be aligned on the scintillator to the exact fiber locations to calibrate the system. However, the exact fiber locations cannot be easily predicted based on the mechanical tolerance of the light optics.

Therefore, what is needed is a method of fiber location mapping for multi-beam calibration and alignment.

BRIEF SUMMARY OF THE DISCLOSURE

An embodiment of the present disclosure provides a method of fiber location mapping in a multi-beam system.

The method may comprise emitting light from a light source. The light may be directed toward a camera.

The method may further comprise providing a fiber bundle. The fiber bundle may comprise a central fiber having one end connected to the light source, and N layers of fibers surrounding the central fiber. A first layer of fibers may be the innermost of the N layers, an Nth layer of fibers may be outermost of the N layers, and N≥2. The first layer of fibers may include M fibers, and each of the M fibers in the first layer of fibers may have one end connected to the light source. The Nth layer of fiber may comprise more than M fibers, and M fibers in the Nth layer of fibers may have one end connected the light source.

The method may further comprise capturing an image set using the camera. The image set may include images corresponding to each fiber connected to the light source.

The method may further comprise determining a centroid of each image in the image set to produce a centroid map using a processor. The processor may determine an intensity of light of each pixel of each image in the image set. When one pixel is determined to have a highest intensity of the pixels in one image, the (x, y) location of the pixel may be determined as the centroid of the image. When more than one pixel is determined to have a highest intensity of the pixels in one image, the centroid of the image may be determined based on the (x, y) locations of each of the pixels having the highest intensity.

The method may further comprise generating, using the processor, a fiber location map comprising fiber locations of all fibers in the fiber bundle based on the centroid map. The processor may be configured to determine pitch and rotation of the centroid of each image in the image set based on the centroid map. The processor may be further configured to determine fiber locations of remaining fibers in the Nth layer of the fiber bundle based on the pitch and rotation. The processor may be further configured to generate a fiber location map comprising the centroids and the fiber locations of the remaining fibers in the Nth layer of the fiber bundle.

According to an embodiment of the present disclosure, the processor may be further configured to determine fiber locations of all fibers between the first layer of fibers and the Nth layer of fibers in the fiber bundle based on the pitch and rotation. The processor may be further configured to generate the fiber location map comprising the centroids, the fiber locations of the remaining fibers in the Nth layer of the fiber bundle, and the fiber locations of all fibers between the first layer of fibers and the Nth layer of fibers in the fiber bundle.

According to an embodiment of the present disclosure, only the central fiber, M fibers in the first layer, and M fibers in the Nth layer may be connected to the light source.

According to an embodiment of the present disclosure, the N layers of fibers may surround the central fiber in a polygon shape, and the M fibers in the Nth layer of fibers may correspond to corners of the polygon shape. The N layers of fibers may surround the central fiber in a hexagon shape, and the M fibers in the Nth layer may correspond to corners of the hexagon shape.

According to an embodiment of the present disclosure, the fiber bundle may comprise more than 300 fibers.

According to an embodiment of the present disclosure, the method may further comprise calibrating the multi-beam system based on the fiber location map. The processor may be further configured to receive an image from a beam source having a multi-beam array. The processor may be further configured to overlay the fiber location map on the image from the beam source. The processor may be further configured to align centers of the fiber location map and the image from the beam source to determine error, wherein the error comprises shift, rotation, orthogonality, aspect ratio, magnification, or astigmatism. The processor may be further configured to perform linear distortion correction based on the error.

Another embodiment of the present disclosure provides a multi-beam system. The system may comprise a light source configured to emit light.

The system may further comprise a fiber bundle. The fiber bundle may comprise a central fiber having one end connected to the light source, and N layers of fibers surrounding the central fiber. The first layer of fibers may be the innermost layer, the Nth layer of fibers is the outermost layer, and N≥2. The first layer of fibers may include M fibers, and each of the M fibers in the first layer of fibers may have one end connected to the light source. The Nth layer of fibers may comprise more than M fibers, and M fibers in the Nth layer of fibers may have one end connected the light source;

The system may further comprise a camera configured to capture an image set. The image set may include images corresponding to each fiber connected to the light source.

The system may further comprise a processor in electronic communication with the camera. The processor may be configured to determine a centroid of each image in the image set to produce a centroid map. The processor may determine an intensity of light of each pixel of each image in the image set. When one pixel is determined to have a highest intensity of the pixels in one image, the (x, y) location of the pixel may be determined as the centroid of the image. When more than one pixel is determined to have a highest intensity of the pixels in one image, the centroid of the image may be determined based on the (x, y) locations of each of the pixels having the highest intensity.

The processor may be further configured to generate a fiber location map comprising fiber locations of all fibers in the fiber bundle based on the centroid map. The processor may be configured to determine pitch and rotation of the centroid of each image in the image set based on the centroid map. The processor may be further configured to determine fiber locations of remaining fibers in the Nth layer of the fiber bundle based on the pitch and rotation. The processor may be further configured to generate a fiber location map comprising the centroids and the fiber locations of the remaining fibers in the Nth layer of the fiber bundle.

According to an embodiment of the present disclosure, the processor may be further configured to determine fiber locations of all fibers between the first layer of fibers and the Nth layer of fibers in the fiber bundle based on the pitch and rotation. The processor may be further configured to generate the fiber location map comprising the centroids, the fiber locations of the remaining fibers in the Nth layer of the fiber bundle, and the fiber locations of all fibers between the first layer of fibers and the Nth layer of fibers in the fiber bundle.

According to an embodiment of the present disclosure, only the central fiber, M fibers in the first layer, and M fibers in the Nth layer may be connected to the light source.

According to an embodiment of the present disclosure, the N layers of fibers may surround the central fiber in a polygon shape, and the M fibers in the Nth layer of fibers may correspond to corners of the polygon shape. The N layers of fibers may surround the central fiber in a hexagon shape, and the M fibers in the Nth layer may correspond to corners of the hexagon shape.

According to an embodiment of the present disclosure, the fiber bundle may comprise more than 300 fibers.

According to an embodiment of the present disclosure, the processor may be further configured to calibrate the multi-beam system based on the fiber location map. The processor may be further configured to receive an image from a beam source having a multi-beam array. The processor may be further configured to overlay the fiber location map on the image from the beam source. The processor may be further configured to align centers of the fiber location map and the image from the beam source to determine error, wherein the error comprises shift, rotation, orthogonality, aspect ratio, magnification, or astigmatism. The processor may be further configured to perform linear distortion correction based on the error.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
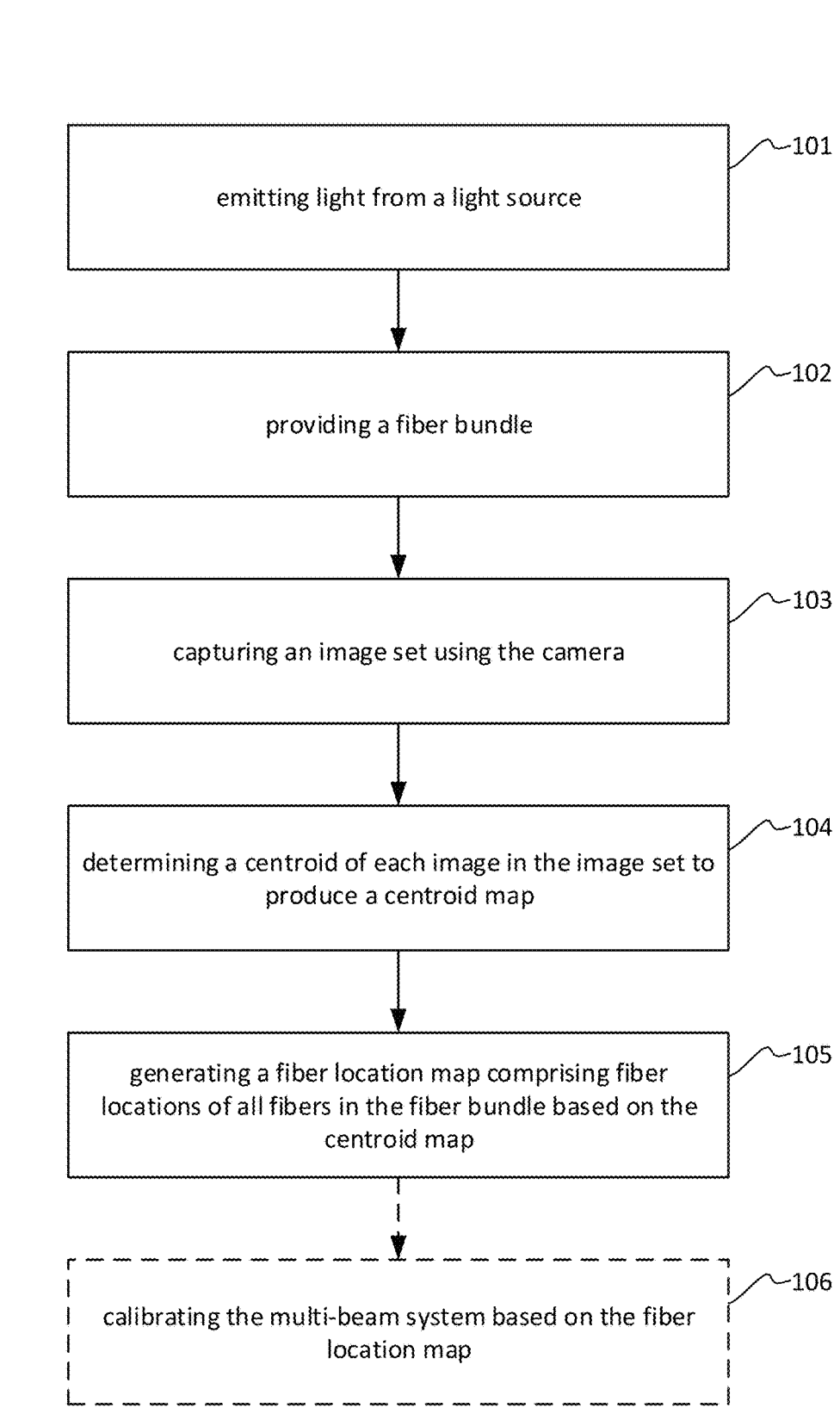
FIG. 1 is a flowchart of a method of fiber location mapping in a multi-beam system according to an embodiment of the present disclosure.

An embodiment of the present disclosure provides a method of fiber location mapping in a multi-beam system. As shown in FIG. 1, the method may comprise the following steps.

At step 101, light is emitted from a light source. The light source may be an LED light source. The light may be directed toward a camera. The camera may be a charge-coupled device (CCD) camera.

At step 102, a fiber bundle is provided. The fiber bundle may comprise a plurality of fibers extending parallel to one another. The fibers may be silica fibers. The diameter of each fiber may vary, based on the wavelengths of light transmissible by the fibers. The plurality of fibers may have the same diameter. The plurality of fibers may be held together by glue or a frame to form the fiber bundle. The fiber bundle may comprise a central fiber. The central fiber may be arranged centrally in the fiber bundle, surrounded by the other fibers in the fiber bundle. In some embodiments, more than one fiber may be arranged centrally in the fiber bundle, and thus these fibers may be collectively considered as the central fiber. The central fiber may have one end connected to the light source. For example, one end of the central fiber may be disposed on the light source such that the light emitted from the light source is directed through the central fiber.

The fiber bundle may further comprise N layers of fibers. The N layers of fibers may surround the central fiber. In the N layers of fibers, a first layer of fibers may be defined as the innermost of the N layers. For example, the first layer may be closest to the central fiber, and may directly surround the central fiber. In the N layers of fibers, an Nth layer of fibers may be defined as the outermost of the N layers. For example, the Nth layer of fibers may be farthest from the central fiber, and may define the outer bounds of the fiber bundle. In the N layers of fibers, N may be greater than or equal to 2. For example, when N=2, the Nth layer of fibers may be the second layer of fibers, and may directly surround the first layer of fibers. In another example, when N=3, the Nth layer of fibers may be the third layer of fibers, and a second layer of fibers may be disposed between the first layer of fibers and the Nth layer of fibers. It can be appreciated that N may be any number greater than 2, and for each increasing number N, additional layers of fibers are provided between the first layer and the Nth layer.

The first layer of fibers may include M fibers. M may be greater than or equal to 4. According to a particular embodiment of the present disclosure, M=6. Each of the M fibers in the first layer of fibers may have one end connected to the light source. For example, one end of each of the M fibers in the first layer may be disposed on the light source such that the light emitted from the light source may be directed through each of the M fibers in the first layer. The Nth layer of fiber may comprise more than M fibers. For example, when N=2 and M=6, the Nth layer of fibers may comprise 12 fibers. When N=3 and M=6, the Nth layer of fibers may comprise 18 fibers. M fibers in the Nth layer of fibers may have one end connected the light source. For example, one end of each of the M fibers in the Nth layer may be disposed on the light source such that the light emitted from the light source may be directed through each of the M fibers in the Nth layer.

According to an embodiment of the present disclosure, only the central fiber, the M fibers in the first layer, and the M fibers in the Nth layer may be connected to the light source. In other words, the number of fibers connected to the light source for any given fiber bundle may be equal to 2M+1. Thus, the remaining fibers in the Nth layer and all fibers in the layers between the first layer and the Nth layer may not be connected to the light source. While more fibers may be connected to the light source, it can be appreciated that minimizing the number of fibers connected to the light source may simplify the system and reduce computational complexity. Each of the fibers connected to the light source may be connected to the light source by a separate connector.

According to an embodiment of the present disclosure, the N layers of fibers may surround the central fiber in a polygon shape. The polygon shape may be a regular polygon shape, meaning that all angles and sides of the polygon may be equal. For example, the polygon shape may be a triangle, square, pentagon, hexagon, heptagon, octagon, or a polygon with any number of sides. The number of M fibers in the first layer of fibers may correspond to the number of sides of the polygon shape. For example, when M=6, the polygon shape may be a hexagon. The M fibers in the Nth layer of fibers may correspond to corners of the polygon shape. For example, the N layers of fibers may surround the central fiber in a hexagon shape, and the M fibers in the Nth layer may correspond to corners of the hexagon shape.

As described above, the number of fibers in the fiber bundle may depend on the number of layers N and the number of fibers in the first layer M. Thus, the fiber bundle may comprise hundreds of fibers, as the number of layers of fibers N surrounding the central fiber increases. For example, the fiber bundle may comprise more than 300 fibers. It can be appreciated that while the fiber bundle may comprise hundreds of fibers, the number of fibers connected to the light source only depends on the M number of fibers in the first layer. For example, when M=6, 13 fibers may be connected to the light source regardless of the number of layers of fibers N or total number of fibers in the fiber bundle.

Figure 2A:
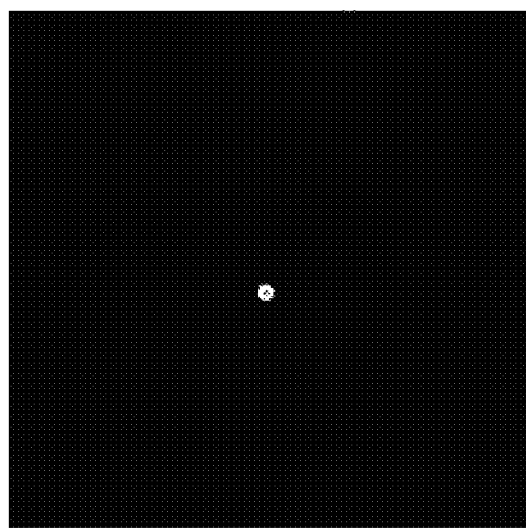
FIG. 2A illustrates an example image of one fiber according to an embodiment of the present disclosure.

At step 103, an image set is captured using the camera. The image set may include images corresponding to each fiber connected to the light source. For example, an image may be captured corresponding to the light directed through the central fiber, the M fibers in the first layer, and the M fibers in the Nth layer. In a particular embodiment where M=6, a total of 13 images may be captured. An example image is shown in FIG. 2A.

Figure 2B:
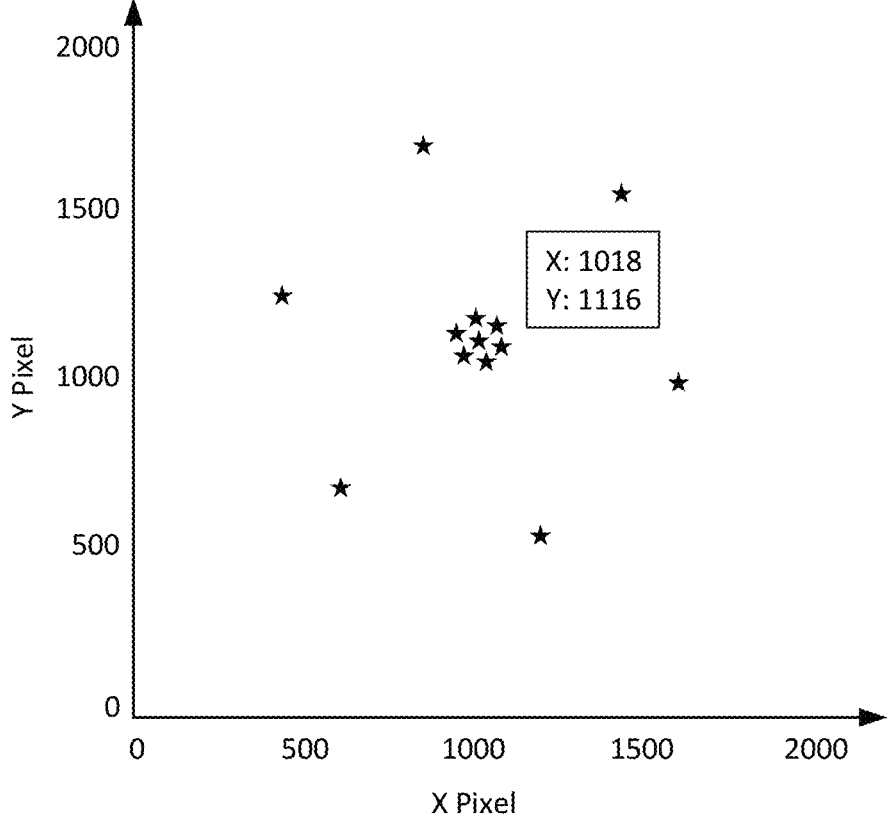
FIG. 2B illustrates an example centroid map according to an embodiment of the present disclosure.

At step 104, a centroid of each image in the image set is determined using a processor, to produce a centroid map. The centroid map may plot the (x, y) locations of each centroid on a graph, for example, as shown in FIG. 2B. The centroid of each image may be determined by image processing. For example, the processor may determine the intensity of the light in each pixel of each image. The processor may perform filtering or smoothing operations to the image to remove noise before processing the image. If a pixel is determined to have a highest/peak intensity, the (x, y) location of this pixel may be determined as the centroid C of the image. If more than one pixel k is determined to have a highest/peak intensity, the centroid C may be determined based on the (x, y) locations of each pixel k. For example, the centroid C may be determined by the following equation:

$$C = \left( \frac{x_1 + \ldots + x_k}{k}, \frac{y_1 + \ldots + y_k}{k} \right)$$

If more than one adjacent pixels have the highest/peak intensity, then the (x, y) location of a center pixel of this group of pixels can be determined as the centroid C of the image.

Figure 3:
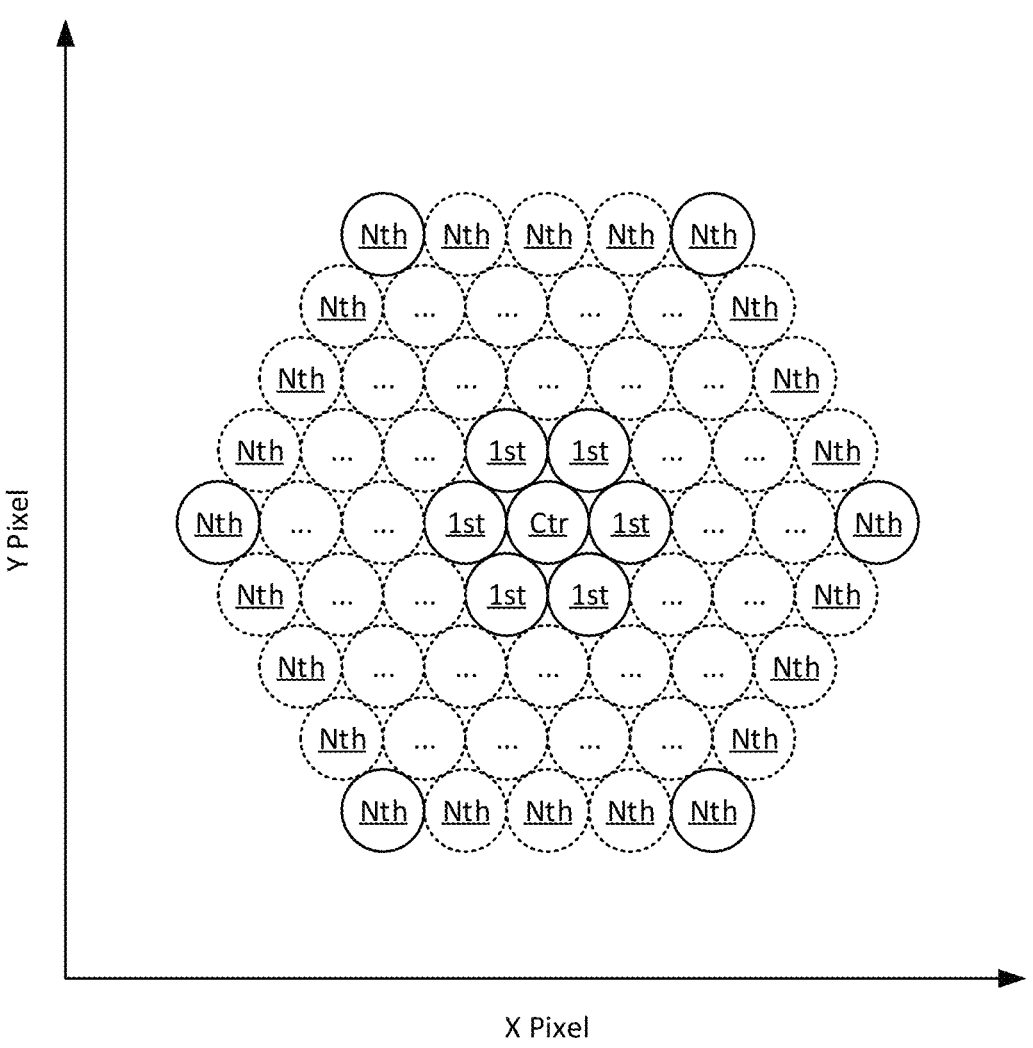
FIG. 3 illustrates an example fiber location map according to an embodiment of the present disclosure.

At step 105, a fiber location map is generated using the processor. The fiber location map may comprise fiber locations of all fibers in the fiber bundle based on the centroid map. For example, as shown in FIG. 3, the fiber location map may plot the (x, y) locations of all fibers in the fiber bundle based on the (x, y) locations of each centroid on the graph. In FIG. 3, the locations of the fibers from the centroid map (i.e., the locations of the central fiber, the M fibers in the first layer, and M fibers in the Nth layer) are shown in solid lines, and the locations of all other fibers (i.e., the remaining fibers in the Nth layer and the fibers in the layers between the first layer and Nth layer) are shown in dotted lines, and can be determined based on the design of the fiber bundle.

According to an embodiment of the present disclosure, step 105 may comprise the following steps. Pitch and rotation of the centroid of each image in the image set may be determined based on the centroid map. The pitch and rotation of the centroid of each image may correspond to a difference between the determined centroid location and an expected location of each fiber. For example, the pitch may be calculated based on the distance between the (x, y) locations of the central fiber and the fibers in the first layer. The rotation may be determined based on the angle of a line extending from the central fiber to a fiber in the first layer. Pitch and rotation also can include comparing between images. It can be appreciated that the centroid location may not be exactly at the expected location due to mechanical tolerance of the light optics. For example, as shown in FIG. 2B, the center fiber centroid is calculated as (1018, 1116), while the expected location is (1024, 1024). Fiber locations of remaining fibers in the Nth layer of the fiber bundle may be determined based on the pitch and rotation. As explained above, the Nth layer of fibers may comprise more than M fibers, but the centroids are determined for only the M fibers in the Nth layer connected to the light source. For example, when N=3 and M=6, there may be 12 remaining fibers in the Nth layer of fibers. The fiber locations of these fibers may be determined based on the pitch and rotation. A fiber location map may be generated, comprising the centroids and the fiber locations of the remaining fibers in the Nth layer of the fiber bundle. For example, as shown in FIG. 3, the fiber location map may plot the (x, y) locations of the remaining fibers in the Nth layer of fibers based on the (x, y) locations of each centroid on the graph.

According to an embodiment of the present disclosure, step 105 may further comprise the following additional steps. Fiber locations of all fibers between the first layer of fibers and the Nth layer of fibers in the fiber bundle may be determined based on the pitch and rotation. As explained above, when N>2, there may be one or more layers of fibers between the first layer of fibers and the Nth layer of fibers. The fiber locations of these fibers may be determined based on the pitch and rotation. The fiber location map may be generated, comprising the centroids, the fiber locations of the remaining fibers in the Nth layer of the fiber bundle, and the fiber locations of all fibers between the first layer of fibers and the Nth layer of fibers in the fiber bundle. For example, as shown in FIG. 3, the fiber location map may plot the (x, y) locations of the fibers between the first layer of fibers and the Nth layer of fibers based on the (x, y) locations of each centroid on the graph and the design of the fiber bundle in terms of N and M.

Figure 4:
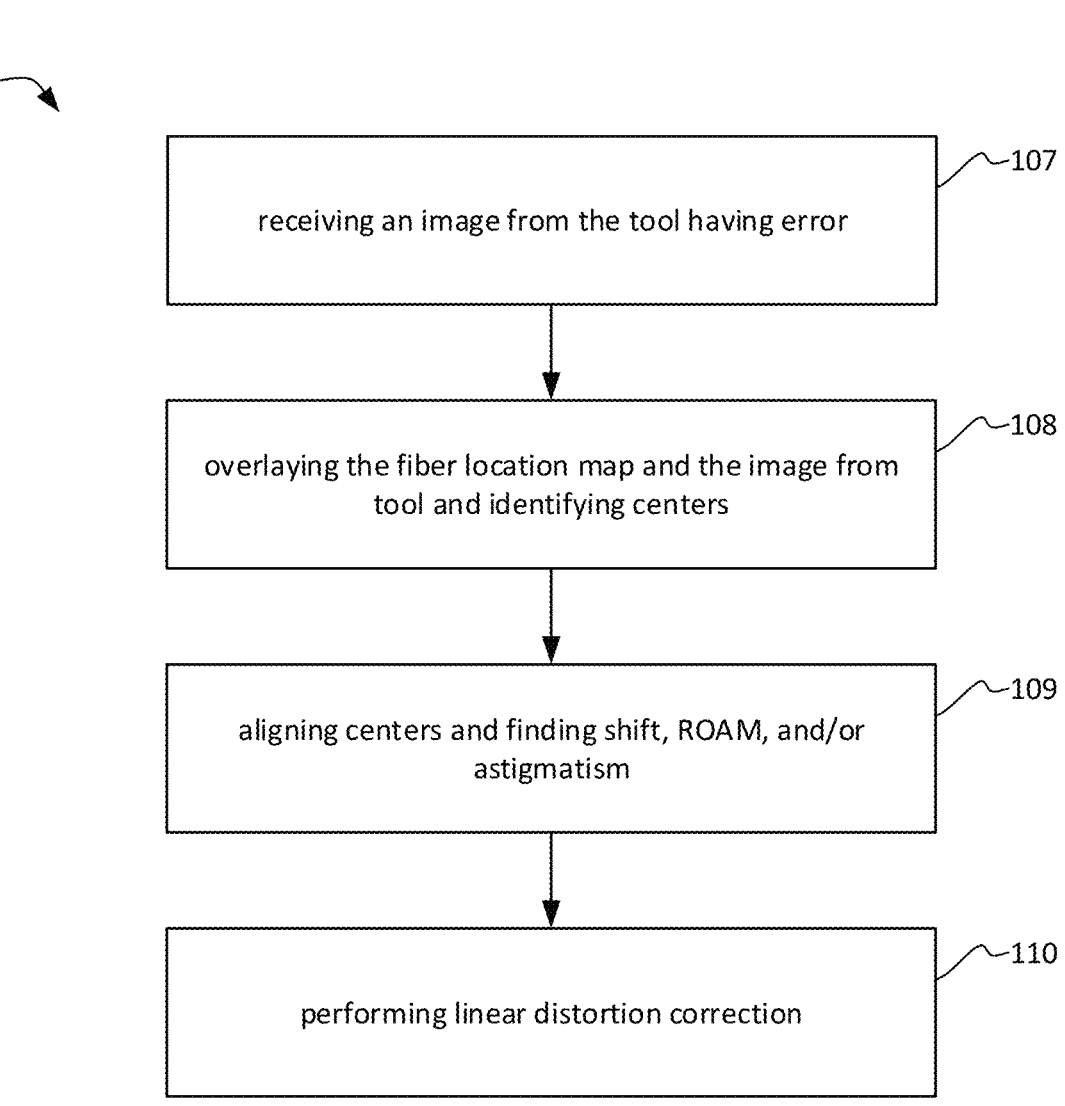
FIG. 4 illustrates further steps of the method of the present disclosure for calibrating the multi-beam system.

According to an embodiment of the present disclosure, the method 100 may further comprise calibrating the multi-beam system based on the fiber location map 106. Calibrating the multi-beam system may comprise the following steps, shown in FIG. 4.

At step 107, the processor may receive an image from the tool having error. The error may comprise shift (x/y deflection), ROAM (rotation, orthogonality, aspect ratio, and/or magnification), or astigmatism (shape distortion). Linear distortion correction may be performed based on the error. A deflector in the system can be used to correct shift error. A lens can be used to correct ROAM error or astigmatism error.

At step 108, the fiber location map may be overlaid on the image from the tool, and the centers may be identified.

At step 109 the centers of the fiber location map and the image from the tool may be aligned, the shift, ROAM, and/or astigmatism can be determined. In other words, the differences between the fiber location map and the image from the tool may be quantified as shift, ROAM, and/or astigmatism.

At step 110, the shift, ROAM, and/or astigmatism can be used to perform linear distortion correction, which can calibrate multi-beam system.

With the method 100 of the present disclosure, a fiber location map may be simply generated, corresponding to the physical locations of each fiber in the fiber bundle. The fiber location map may be used to calibrate and align a multi-beam source to improve accuracy and efficiency of inspection processes.

Figure 5A:
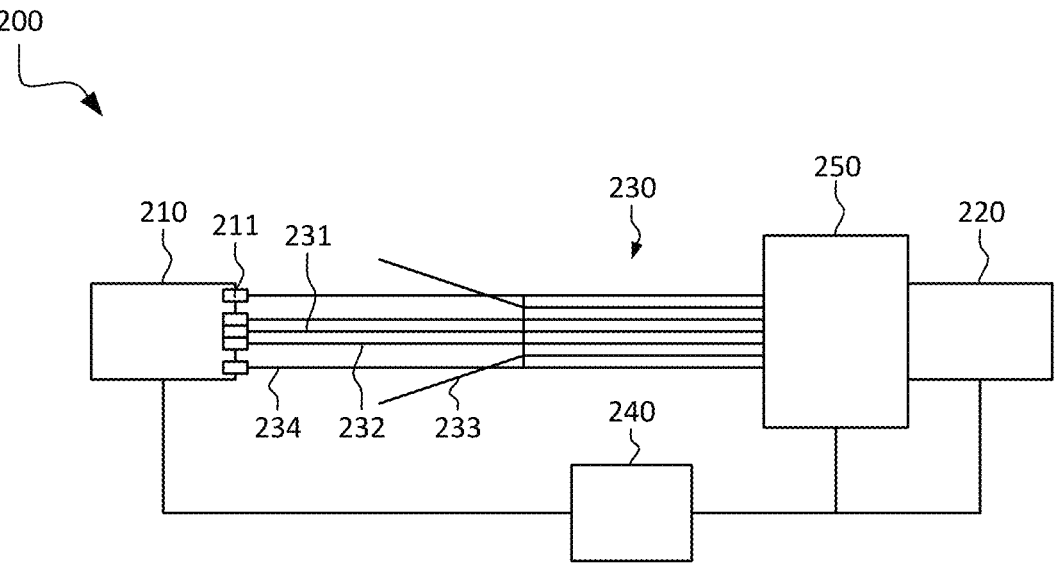
FIG. 5A is a schematic of a multi-beam system according to an embodiment of the present disclosure.

An embodiment of the present disclosure, shown in FIG. 5A, provides an apparatus 200. The apparatus 200 may comprise a light source 210 configured to emit light. Light from the light source 210 may be directed toward a camera 220. The camera 220 may be a charge-coupled device (CCD) camera.

The apparatus 200 may further comprise a fiber bundle 230. The fiber bundle 230 may comprise a plurality of fibers extending parallel to one another. The fibers may be silica fibers. The diameter of each fiber may vary, based on the wavelengths of light transmissible by the fibers. The plurality of fibers may have the same diameter. The plurality of fibers may be held together by glue or a frame to form the fiber bundle 230. The fiber bundle 230 may comprise a central fiber 231. The central fiber 231 may be arranged centrally in the fiber bundle 230, surrounded by the other fibers in the fiber bundle 230. In some embodiments, more than one fiber may be arranged centrally in the fiber bundle, and thus these fibers may be collectively considered as the central fiber. The central fiber 231 may have one end connected to the light source 210. For example, one end of the central fiber 231 may be disposed on the light source 210 such that the light emitted from the light source 210 is directed through the central fiber 231.

The fiber bundle 230 may further comprise N layers of fibers surrounding the central fiber 231. In the N layers of fibers, a first layer of fibers 232 may be defined as the innermost of the N layers. For example, the first layer 232 may be closest to the central fiber 231, and may directly surround the central fiber 231. In the N layer of fibers, an Nth layer of fibers 234 may be defined as the outermost of the N layers. For example, the Nth layer of fibers 234 may be farthest from the central fiber 231, and may define the outer bounds of the fiber bundle 230. In the N layers of fibers, N may be greater than or equal to 2. For example, when N=2, the Nth layer of fibers 234 may be the second layer of fibers, and may directly surround the first layer of fibers 232. In another example shown in FIG. 5B, when N=3, the Nth layer of fibers 234 may be the third layer of fibers, and a second layer of fibers 233 may be disposed between the first layer of fibers 232 and the Nth layer of fibers 234. It can be appreciated that N may be any number greater than 2, and for each increasing number N, additional layers of fibers 233 are provided between the first layer of fibers 232 and the Nth layer of fibers 234.

Figure 5B:
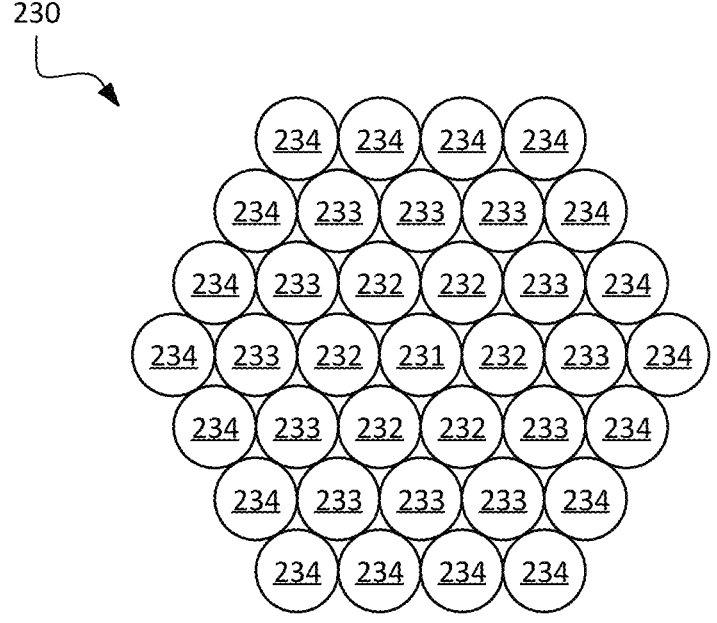
FIG. 5B is a schematic cross-sectional view of a fiber bundle according to an embodiment of the present disclosure.

The first layer of fibers 232 may include M fibers. M may be greater than or equal to 4. According to a particular embodiment of the present disclosure shown in FIG. 5B, M=6. Each of the M fibers in the first layer of fibers 232 may have one end connected to the light source 210. For example, one end of each of the M fibers in the first layer of fibers 232 may be disposed on the light source 210 such that the light emitted from the light source 210 may be directed through each of the M fibers in the first layer of fibers 232. The Nth layer of fibers 234 may comprise more than M fibers. For example, when N=2 and M=6, the Nth layer of fibers 234 may comprise 12 fibers. When N=3 and M=6, as shown in FIG. 5B, the Nth layer of fibers 234 may comprise 18 fibers. M fibers in the Nth layer of fibers 234 may have one end connected the light source 210. For example, one end of each of the M fibers in the Nth layer of fibers 234 may be disposed on the light source 210 such that the light emitted from the light source 210 may be directed through each of the M fibers in the Nth layer of fibers 234.

According to an embodiment of the present disclosure, only the central fiber 231, the M fibers in the first layer 232, and the M fibers in the Nth layer 234 may be connected to the light source 210. In other words, the number of fibers connected to the light source 210 for any given fiber bundle 230 may be equal to 2M+1. Thus, the remaining fibers in the Nth layer 234 and all fibers in the layers between the first layer of fibers 232 and the Nth layer of fibers 234 may not be connected to the light source 210. For example, as shown in FIG. 5A, fibers in the second layer of fibers 233 may not be connected to the light source 210. While more fibers may be connected to the light source 210, it can be appreciated that minimizing the number of fibers connected to the light source may simplify the system and reduce computational complexity. Each of the fibers connected to the light source 210 may be connected to the light source 210 by a separate connector 211.

According to an embodiment of the present disclosure, the N layers of fibers 234 may surround the central fiber 231 in a polygon shape. The polygon shape may be a regular polygon shape, meaning that all angles and sides of the polygon may be equal. For example, the polygon shape may be a triangle, square, pentagon, hexagon, heptagon, octagon, or a polygon with any number of sides. The number of M fibers in the first layer of fibers 232 may correspond to the number of sides of the polygon shape. For example, when M=6, the polygon shape may be a hexagon. The M fibers in the Nth layer 234 of fibers may correspond to corners of the polygon shape. For example, the N layers of fibers 234 may surround the central fiber 231 in a hexagon shape, and the M fibers in the Nth layer of fibers 234 may correspond to corners of the hexagon shape.

As described above, the number of fibers in the fiber bundle may depend on the number of layers N and the number of fibers in the first layer M. Thus, the fiber bundle 230 may comprise hundreds of fibers, as the number of layers of fibers N surrounding the central fiber 231 increases. For example, the fiber bundle 230 may comprise more than 300 fibers. It can be appreciated that while the fiber bundle 230 may comprise hundreds of fibers, the number of fibers connected to the light source 210 only depends on the M number of fibers in the first layer 232. For example, when M=6, 13 fibers may be connected to the light source 210 regardless of the number of layers of fibers N or total number of fibers in the fiber bundle 230.

The apparatus 200 may further comprise a camera 220. The camera 220 may be configured to capture an image set. The image set may include images corresponding to each fiber connected to the light source 210. For example, an image may be captured corresponding to the light directed through the central fiber 231, the M fibers in the first layer of fibers 232, and the M fibers in the Nth layer of fibers 234. In a particular embodiment where M=6, a total of 13 images may be captured by the camera 220. An example image is shown in FIG. 2A.

The apparatus 200 may further comprise a processor 240. The processor 240 may include a microprocessor, a micro-controller, or other devices.

The processor 240 may be coupled to the components of the apparatus 200 in any suitable manner (e.g., via one or more transmission media, which may include wired and/or wireless transmission media) such that the processor 240 can receive output. The processor 240 may be configured to perform a number of functions using the output. The wafer inspection tool can receive instructions or other information from the processor 240. The processor 240 optionally may be in electronic communication with another wafer inspection tool, a wafer metrology tool, or a wafer review tool (not illustrated) to receive additional information or send instructions.

The processor 240 is in electronic communication with the wafer inspection tool, such as the camera 220. The processor 240 may be configured to process images generated using measurements from the camera 220. For example, the processor may perform embodiments of the method 100.

The processor 240 may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 240 may be disposed in or otherwise part of the apparatus 200 or another device. In an example, the processor 240 and may be part of a standalone control unit or in a centralized quality control unit. Multiple processors 240 may be used, defining multiple subsystems of the apparatus 200.

The processor 240 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 240 to implement various methods and functions may be stored in readable storage media, such as a memory.

If the apparatus 200 includes more than one subsystem, then the different processors 240 may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 240 may be configured to perform a number of functions using the output of the apparatus 200 or other output. For instance, the processor 240 may be configured to send the output to an electronic data storage unit or another storage medium. The processor 240 may be further configured as described herein.

The processor 240 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 240 may be configured according to any of the embodiments described herein. The processor 240 also may be configured to perform other functions or additional steps using the output of the apparatus 200 or using images or data from other sources.

The processor 240 may be communicatively coupled to any of the various components or sub-systems of apparatus 200 in any manner known in the art. Moreover, the processor 240 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 240 and other subsystems of the apparatus 200 or systems external to apparatus 200. Various steps, functions, and/or operations of apparatus 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 240 (or computer subsystem) or, alternatively, multiple processors 240 (or multiple computer subsystems). Moreover, different subsystems of the apparatus 200 may include one or more computing or logic systems. Therefore, the above description should not be interpreted as a limitation on the present disclosure but merely an illustration.

The processor 240 may be configured to determine a centroid of each image in the image set to produce a centroid map. The centroid map may plot the (x, y) locations of each centroid on a graph, for example, as shown in FIG. 2B. The centroid of each image may be determined by image processing. For example, the processor 240 may determine the intensity of the light in each pixel of each image. The processor 240 may perform filtering or smoothing operations to the image to remove noise before processing the image. If a pixel is determined to have a highest/peak intensity, the (x, y) location of this pixel may be determined as the centroid C of the image. If more than one pixel k is determined to have a highest/peak intensity, the centroid C may be determined based on the (x, y) locations of each pixel k. For example, the centroid C may be determined by the following equation:

$$C = \left( \frac{x_1 + \ldots + x_k}{k}, \frac{y_1 + \ldots + y_k}{k} \right)$$

If more than one adjacent pixels have the highest/peak intensity, then the (x, y) location of a center pixel of this group of pixels can be determined as the centroid C of the image.

The processor 240 may be further configured to generate a fiber location map comprising fiber locations of all fibers in the fiber bundle 230 based on the centroid map. For example, as shown in FIG. 3, the fiber location map may plot the (x, y) locations of all fibers in the fiber bundle 230 based on the (x, y) locations of each centroid on the graph. In FIG. 3, the locations of the fibers from the centroid map (i.e., the locations of the central fiber 231, the M fibers in the first layer 232, and M fibers in the Nth layer 234) are shown in solid lines, and the locations of all other fibers (i.e., the remaining fibers in the Nth layer 234 and the fibers in the layers between the first layer and Nth layer) are shown in dotted lines, and can be determined based on the design of the fiber bundle 230.

According to an embodiment of the present disclosure, the processor 240 may be further configured to determine pitch and rotation of the centroid of each image in the image set based on the centroid map. The pitch and rotation of the centroid of each image may correspond to a difference between the determined centroid location and an expected location of each fiber in the fiber bundle 230. For example, the pitch may be calculated based on the distance between the (x, y) locations of the central fiber 231 and the fibers in the first layer 232. The rotation may be determined based on the angle of a line extending from the central fiber 231 to a fiber in the first layer 232. It can be appreciated that the centroid location may not be exactly at the expected location due to mechanical tolerance of the light optics. For example, as shown in FIG. 2B, the center fiber 231 has a centroid calculated as (1018, 1116), while the expected location is (1024, 1024).

The processor 240 may be further configured to determine fiber locations of remaining fibers in the Nth layer of fibers 234 in the fiber bundle 230 based on the pitch and rotation. As explained above, the Nth layer of fibers 234 may comprise more than M fibers, but the centroids are determined for only the M fibers in the Nth layer connected to the light source 210. For example, when N=3 and M=6, there may be 12 remaining fibers in the Nth layer of fibers 234. The fiber locations of these fibers may be determined based on the pitch and rotation.

The processor 240 may be further configured to generate a fiber location map comprising the fiber locations of the remaining fibers in the Nth layer of fibers 234 in the fiber bundle 230. For example, as shown in FIG. 3, the fiber location map may plot the (x, y) locations of the remaining fibers in the Nth layer of fibers 234 based on the (x, y) locations of each centroid on the graph and the design of the fiber bundle in terms of N and M.

According to an embodiment of the present disclosure, the processor 240 may be further configured to determine fiber locations of all fibers between the first layer of fibers 232 and the Nth layer of fibers 234 in the fiber bundle 230 based on the pitch and rotation. As explained above, when N>2, there may be one or more layers of fibers 233 between the first layer of fibers 232 and the Nth layer of fibers 234. The fiber locations of these fibers 233 may be determined based on the pitch and rotation.

The processor 240 may be further configured to generate the fiber location map comprising the centroids, the fiber locations of the remaining fibers in the Nth layer of fibers 234 in the fiber bundle 230, and the fiber locations of all fibers between the first layer of fibers 232 and the Nth layer of fibers 234 in the fiber bundle 230. Accordingly, the fiber location map may comprise locations of all fibers 231, 232, 233, 234 in the fiber bundle 230.

According to an embodiment of the present disclosure, the processor 240 may be further configured to calibrate the multi-beam system based on the fiber location map. The processor 240 may be configured to overlay the fiber location map on an image from a beam source 250 having a multi-beam array. The processor 240 may be configured to align the fiber location map and the image from the beam source to determine error. The error may comprise shift (x/y deflection), ROAM (rotation, orthogonality, aspect ratio, magnification), or astigmatism (shape distortion). The differences between the fiber location map and the image from the tool may be quantified as shift, ROAM, and/or astigmatism. The processor 240 may be configured to perform linear distortion correction based on the error to calibrate the beam source 250. The apparatus 200 also can include various lenses, apertures, deflectors, or other components. A deflector can be used to correct shift error. A lens can be used to correct ROAM error or astigmatism error.

With the apparatus 200 of the present disclosure, a fiber location map may be simply generated, corresponding to the physical locations of each fiber in the fiber bundle 230. The fiber location map may be used to calibrate and align a multi-beam source to improve accuracy and efficiency of inspection processes.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method of fiber location mapping in a multi-beam system, the method comprising:
   emitting light from a light source, the light being directed toward a camera;
   providing a fiber bundle, comprising:
      a central fiber having one end connected to the light source; and
      N layers of fibers surrounding the central fiber, wherein a first layer of fibers is innermost of the N layers, an Nth layer of fibers is outermost of the N layers, and N≥2;
      wherein the first layer of fibers includes M fibers, each of the M fibers in the first layer of fibers has one end connected to the light source, the Nth layer of fiber comprises more than M fibers, and +M fibers in the Nth layer of fibers have one end connected the light source;
   capturing an image set using the camera, the image set including images corresponding to each fiber connected to the light source;
   determining a centroid of each image in the image set to produce a centroid map using a processor; and
   generating, using the processor, a fiber location map comprising fiber locations of all fibers in the fiber bundle based on the centroid map.

2. The method of claim 1, wherein determining a centroid of each image in the image set comprises:
   determining an intensity of light of each pixel of each image in the image set;
   when one pixel is determined to have a highest intensity of the pixels in one image, determining the (x, y) location of the pixel as the centroid of the image; and
   when more than one pixel is determined to have a highest intensity of the pixels in one image, determining the centroid of the image based on the (x, y) locations of each of the pixels having the highest intensity.

3. The method of claim 1, wherein generating a fiber location map comprising fiber locations of all fibers in the fiber bundle based on the centroid map comprises:
   determining pitch and rotation of the centroid of each image in the image set based on the centroid map;
   determining fiber locations of remaining fibers in the Nth layer of the fiber bundle based on the pitch and rotation; and
   generating a fiber location map comprising the centroids and the fiber locations of the remaining fibers in the Nth layer of the fiber bundle.

4. The method of claim 3, wherein generating a fiber location map comprising fiber locations of all fibers in the fiber bundle based on the centroid map further comprises:
   determining fiber locations of all fibers between the first layer of fibers and the Nth layer of fibers in the fiber bundle based on the pitch and rotation; and
   generating the fiber location map comprising the centroids, the fiber locations of the remaining fibers in the Nth layer of the fiber bundle, and the fiber locations of all fibers between the first layer of fibers and the Nth layer of fibers in the fiber bundle.

5. The method of claim 1, wherein only the central fiber, M fibers in the first layer, and M fibers in the Nth layer are connected to the light source.

6. The method of claim 1, wherein the N layers of fibers surround the central fiber in a polygon shape, and the M fibers in the Nth layer of fibers correspond to corners of the polygon shape.

7. The method of claim 6, wherein the N layers of fibers surround the central fiber in a hexagon shape, and the M fibers in the Nth layer correspond to corners of the hexagon shape.

8. The method of claim 1, wherein the fiber bundle comprises more than 300 fibers.

9. The method of claim 1, further comprising:
   calibrating the multi-beam system based on the fiber location map.

10. The method of claim 9, wherein calibrating the multi-beam system based on the fiber location map comprises:
   receiving an image from a beam source having a multi-beam array;
   overlaying the fiber location map on the image from the beam source;
   aligning centers of the fiber location map and the image from the beam source to determine error, wherein the error comprises shift, rotation, orthogonality, aspect ratio, magnification, or astigmatism; and
   performing linear distortion correction based on the error.

11. A multi-beam system comprising:
   a light source configured to emit light;
   a fiber bundle, comprising:
      a central fiber having one end connected to the light source; and
      N layers of fibers surrounding the central fiber, wherein the first layer of fibers is the innermost layer, the Nth layer of fibers is the outermost layer, and N≥2;
      wherein the first layer of fibers includes M fibers, each of the M fibers in the first layer of fibers has one end connected to the light source, the Nth layer of fibers comprises more than M fibers, and M fibers in the Nth layer of fibers have one end connected the light source;
   a camera configured to capture an image set, the image set including images corresponding to each fiber connected to the light source; and
   a processor in electronic communication with the camera that is configured to:
      determine a centroid of each image in the image set to produce a centroid map; and
      generate a fiber location map comprising fiber locations of all fibers in the fiber bundle based on the centroid map.

12. The system of claim 11, wherein the processor is configured to determine a centroid of each image in the image set by steps of:

determining an intensity of light of each pixel of each image in the image set;

when one pixel is determined to have a highest intensity of the pixels in one image, determining the (x, y) location of the pixel as the centroid of the image; and when more than one pixel is determined to have a highest intensity of the pixels in one image, determining the centroid of the image based on the (x, y) locations of each of the pixels having the highest intensity.

13. The system of claim 11, wherein the processor is configured to generate a fiber location map comprising fiber locations of all fibers in the fiber bundle based on the centroid map by steps of:

determining pitch and rotation of the centroid of each image in the image set based on the centroid map;

determining fiber locations of remaining fibers in the Nth layer of the fiber bundle based on the pitch and rotation; and generating a fiber location map comprising the fiber locations of the remaining fibers in the Nth layer of the fiber bundle.

14. The system of claim 13, wherein the processor is configured to generate a fiber location map comprising fiber locations of all fibers in the fiber bundle based on the centroid map by further steps of:

determining fiber locations of all fibers between the first layer of fibers and the Nth layer of fibers in the fiber bundle based on the pitch and rotation; and generating the fiber location map comprising the centroids, the fiber locations of the remaining fibers in the Nth layer of the fiber bundle, and the fiber locations of all fibers between the first layer of fibers and the Nth layer of fibers in the fiber bundle.

15. The system of claim 11, wherein only the central fiber, the M fibers in the first layer of fibers, and the M fibers in the Nth layer of fibers are connected to the light source.

16. The system of claim 11, wherein the N layers of fibers surround the central fiber in a polygon shape, and the M fibers in the Nth layer of fibers correspond to corners of the polygon shape.

17. The system of claim 16, wherein the N layers of fibers surround the central fiber in a hexagon shape, and the M fibers in the Nth layer correspond to corners of the hexagon shape.

18. The system of claim 11, wherein the fiber bundle comprises more than 300 fibers.

19. The system of claim 11, wherein the processor is further configured to:

calibrate the multi-beam system based on the fiber location map.

20. The system of claim 19, wherein the processor is configured to calibrate the multi-beam system based on the fiber location map by steps of:

receiving an image from a beam source having a multi-beam array;

overlaying the fiber location map on the image from the beam source;

aligning centers of the fiber location map and the image from the beam source to determine error, wherein the error comprises shift, rotation, orthogonality, aspect ratio, magnification, or astigmatism; and performing linear distortion correction based on the error.

* * * * *